United States Patent

Pekola et al.

[11] Patent Number: 5,974,806
[45] Date of Patent: Nov. 2, 1999

[54] MICRO REFRIGERATOR

[75] Inventors: Jukka Pekola; Antti Manninen; Mikko Leivo, all of Jyväskylä, Finland

[73] Assignee: Nanoway Oy, Jyvaskyla, Finland

[21] Appl. No.: 09/064,390

[22] Filed: Apr. 1, 1998

[51] Int. Cl.[6] .............................. F25B 21/00; F25B 21/02
[52] U.S. Cl. ................................. 62/3.1; 62/3.7; 136/203; 136/236.1
[58] Field of Search .......................... 62/3.2, 3.1, 3.7; 136/203, 236.1, 239, 240, 241

[56] References Cited

U.S. PATENT DOCUMENTS

| | | | |
|---|---|---|---|
| 4,362,023 | 12/1982 | Falco | 62/3 |
| 5,264,375 | 11/1993 | Bang et al. | 437/3 |
| 5,634,718 | 6/1997 | Martinis et al. | 374/32 |

FOREIGN PATENT DOCUMENTS

0425165 A2  5/1991  European Pat. Off. ........ H01L 35/22

OTHER PUBLICATIONS

"Electronic microrefrigerator based on a normal–insulator––superconductor tunnel junction"; M. Nahum et al.; Applied Physics Letters 65 (No. 24), Dec. 12, 1994, pp. 3123–3125.

"Efficient Peltier refrigeration by a pair of normal metal/insulator/superconductor junctions"; M.M. Leivo et al.; Applied Physics Letters 68 (No. 14), Apr. 1, 1996.

"Superconducting Tunnel Junction"; IBM Technical Disclosure Bulletin; vol. 13, No. 5, Oct. 1970, New York.

Leivo et al, Efficien Peltier refrigeration by a Pair of Normal Metal/Insulator/Superconductor Junctions, Applied Physics Letters 68 (14), Apr. 1996.

*Primary Examiner*—William Doerrler
*Attorney, Agent, or Firm*—Fildes & Outland, P.C.

[57] ABSTRACT

A micro refrigerator includes two NIS, normal metal/insulator/superconductor tunnel junction refrigerators formed on a substrate connected in series in a SINIS structure, with a common normal metal element connected therebetween and the superconducting elements outside. The refrigerator includes an insulating membrane thermally isolated from the substrate, and the common normal metal element includes a protrusion extending to the insulating membrane, which refrigerates the insulating membrane and an object placed on the insulating membrane.

12 Claims, 1 Drawing Sheet

MICRO REFRIGERATOR

FIELD OF THE INVENTION

This invention relates to a micro refrigerator, which comprises two metal/insulator/superconductor (NIS) tunnel junctions formed on a substrate connected in series in a SINIS form. A common normal metal element is connected between the two tunnel junctions and superconductor elements are connected outside. A bias voltage induced between the opposing superconductor elements creates an electronic current in both tunnel junctions, which cools the normal metal element, which is located close to an object to be cooled.

BACKGROUND OF THE INVENTION

Certain radiation sensors, bolometers, used in space research demand a temperature of less than 1 Kelvin, if good energy resolution is wanted. The temperature range 100–300 mK cannot be achieved using simple devices. A temperature of about 0.3–1 K can be achieved using a Helium-3 ($He_3$) evaporator, but even this is insufficient in certain cases.

A Peltier refrigerator utilizing a superconductor element is described in the paper Nahum, M. et al; *Applied Physics Letters* 65, 1994, page 31–23. Normal metal/insulator/ superconductor, i.e. NIS junctions operate at extremely low temperatures of less than 10 Kelvin. An NIS refrigerator has the drawback that it is difficult to thermally insulate the cooled normal metal element. An improved refrigerator construction is described in the paper Leivo, M. M.; Pekola, J. P.; Averin, D. V. 'Efficient Peltier refrigeration by a pair of normal metal/insulator/superconductor junctions', *Applied Physics Letters* 68 (14), 1996, page 1996. When two NIS junctions are connected in a SINIS structure, the connected normal metal element is thermally insulated on both sides.

In addition to the cooling element, the object itself that is to be cooled must be thermally insulated from the substrate. On the other hand, the heat transmitted to the superconductor in the NIS junctions must be effectively conducted away, so that it does not limit the cooling power. In known solutions, the cooling has only been a few milliKelvins at 300 mK, though in theory a considerably greater temperature difference could have been achieved.

SUMMARY OF THE INVENTION

The object of the invention is to create an improved micro refrigerator, whereby a temperature in the order of 100 mK can be achieved in a desired object more simply than previously.

In carrying out the above object and other objects, the invention the micro refrigerator, includes two NIS, normal metal/insulator/superconductor tunnel junction refrigerators, formed on a substrate connected in series in a SINIS structure. A common normal metal element is connected therebetween and the superconducting elements outside. A bias voltage induced between the superconducting elements creates an electronic current in both tunnel junctions, cooling the normal metal element, which is located close to an object to be cooled.

The refrigerator includes an insulating membrane thermally isolated from the substrate, on which the object is placed, and the common normal metal element includes a protrusion extending to the insulating membrane, which cools the insulating membrane and thus the object.

The insulating membrane is part of the surface layer on the substrate, which continues over an opening formed in the substrate. In the area of the opening, the insulating membrane is supported from the substrate by at least one narrow strip. In an illustrative embodiment there are 2–4 strips having a width of 1–10% of the average diameter of the insulating membrane.

The width of the protrusion is, at its narrowest, 0.5–1 $\mu$m and its thickness is 0.05 $\mu$m (20–250 nm) and that it includes a section that widens on the insulating membrane, the surface area of which is at least double the surface area of the rest of the normal metal element.

The insulating membrane is supported from the substrate by at least one protrusion of the normal metal element pair. The size of said insulating membrane is 200 $\mu$m×200 $\mu$m±500 nm and the thickness of the insulating membrane is 50–500 nm. The insulating membrane generally comprises silicon nitride, with a basic structure $Si_3N_4$.

Preferably the superconducting elements are fabricated from a substance from the following group: aluminum (Al), niobium (Nb), high-temperature superconductors (YBCO) and the normal metal elements including protrusion are fabricated from a substance from the following group: copper (Cu), silver (Ag), gold (Au). 3–100 parallel tunnel junctions are fabricated by electron beam lithography in both of the NIS refrigerators of the SINIS unit and at least 1 tunnel junction in both of the NIS refrigerators of the SINIS unit are fabricated by photolithography.

When the cooling NIS junctions are on the substrate, heat is transmitted with little resistance. The superconductor elements heated up are at the bottom. Advantageously, the thermal conductivity of the normal metal element is much greater than that of the substrate and the insulating membrane formed from it. It then efficiently collects the heat from the insulating membrane, which is thermally separated from the substrate. This takes place advantageously by cutting the direct connection of the insulating membrane at the boundary area of the opening and by supporting it from the substrate by means of narrow strips.

These and other features and advantages of the invention will be more fully understood from the following detailed description of the invention taken together with the accompanying drawings.

DETAILED DESCRIPTION OF THE INVENTION

Figure 1:
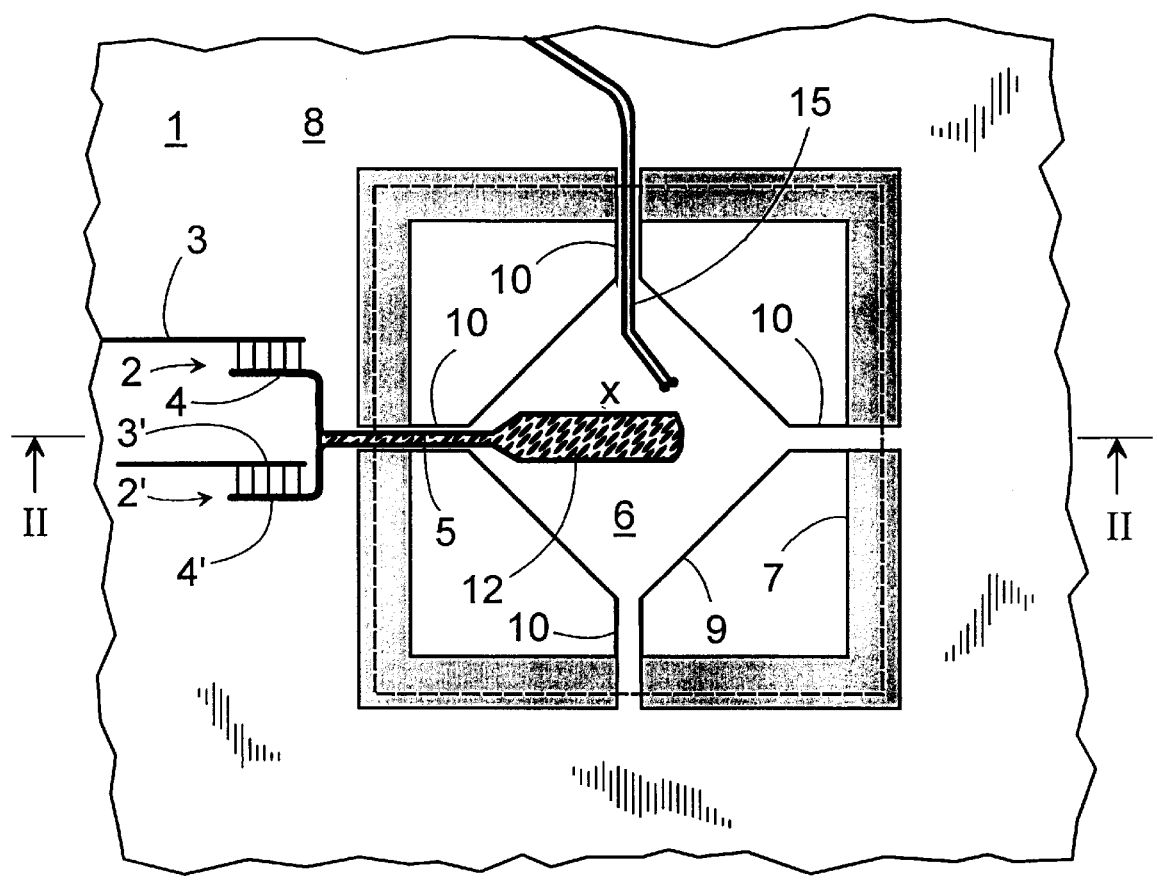
FIG. 1 shows the layout of the SINIS refrigerator on the substrate.

Referring now to the drawings in detail, a micro refrigerator is fabricated on substrate 1, the material of which is silicon, with a thickness of 0.5 mm. On its surface, there is a thin (50–500 nm) layer 8 of silicon nitride, basic structure $Si_3N_4$. In the middle of the chip, there is a 400 $\mu$m×400 $\mu$m window of silicon nitride, which is fabricated by etching silicon away, creating an opening 7 that penetrates the silicon layer. The scale of FIG. 2 is distorted to improve the illustration. A highly efficient thermally insulating membrane 6 has been created in substrate 1 by cutting openings 9 in the original membrane. These leave the insulating membrane 6 resting on thin supports 10 only. The size of the insulating membrane is advantageously 200 $\mu$m×200 $\mu$m±50%, FIG. 1.

Series connected NIS tunnel junction refrigerators 2 and 2' are made as close as possible to the edge of opening 7.

They are fabricated by electron beam lithography as follows. Firstly superconducting comb-like elements 3 and 3' are 30 nm thick aluminum wires. Niobium (Nb) or some high temperature superconductor (YBCO) can also be used. The aluminum elements (Al) are oxidized, providing the insulating layers of the tunnel junctions. Next, common normal metal elements 4 and 4' are made, along with a copper protrusion 5 extending to the insulating membrane, with a width at its narrowest of 0.5–1 $\mu$m and a thickness of about 0.05 $\mu$m (20–250 nm). The end 12 of protrusion 5 is widened to improve thermal conductivity to insulating membrane 6. The surface area of the widened section 12 is advantageously at least twice the surface area of the rest of the normal metal element 4, 4' Silver (Ag) or gold (Au) can also be used in place of copper (Cu).

Figure 2:
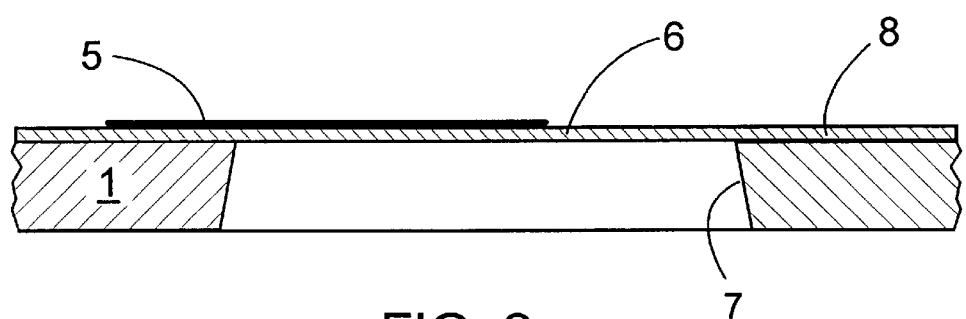
FIG. 2 shows a cross-section of FIG. 1 at point II.

The material of the surface layer 8 has been selected so that it will form, as an insulating membrane 6, a base with a reasonably even temperature for the object to be cooled, which in FIG. 1 is shown diagrammatically by the letter X. It is essential that as small a part of the normal metal element 4, 4' as possible remains outside the membrane, so that heat is not conducted into it from the substrate. In the normal metal element, heat is transmitted along with the electrons. These have a poor contact with the lattice of the substrate. Superconducting elements 3 and 3' are connected thermally through their lattice to the substrate, through the thin insulating layer.

According to FIG. 1, the insulating membrane 6 is supported by four (generally 2–4 pcs.) narrow strips or support 10. Their width is 1–10% of the average diameter of the insulating membrane 6. Both protrusion 5 and the leads required by object X are led through these strips.

By way of example, the leads required by the temperature sensor are drawn in the figure. These are led away along another strip. These other leads are advantageously of superconducting aluminum, which does not transport heat to the insulating membrane 6.

Electron beam lithography permits a large number of parallel tunnel junctions of similar quality (3–100 pcs.). Photolithography, on the other hand, can be used to make tunnel junctions with a large surface area, when they need be no more than 1 or 2 pcs.

There may be more than one SINIS refrigerator. Their normal metal protrusions are located in different strips. Alternatively, the insulating membrane is supported by only one or more normal metal protrusions.

The object to be cooled is attached to the membrane and may form a unit that has a structure that is essentially thicker than the membrane. The thin edges and narrow supports of the membrane form thermal insulation.

In the publication Manninen-Leivo-Pekola, *Applied Physics Letters* 70(14), 1997, p. 1885, there is a description of the background of a corresponding SINIS refrigerator and the dimensioning of tunnel junctions.

Although the invention has been described by reference to a specific embodiment, it should be understood that numerous changes may be made within the spirit and scope of the inventive concepts described. Accordingly, it is intended that the invention not be limited to the described embodiment, but that it have the full scope defined by the language of the following claims.

What is claimed is:

1. A micro refrigerator operable at a temperature to secure a superconductive state for elements of a SINIS structure, comprising two NIS, normal metal/insulator/superconductor tunnel junction refrigerators, formed on a substrate connected in series in a SINIS structure, having a common normal metal element connected between the superconducting elements outside, and a bias voltage induced between the superconducting elements creates an electronic current in both tunnel junctions, cooling the normal metal element, which is located close to an object to be cooled, characterized in that:

the refrigerator includes an insulating membrane thermally isolating said object from the substrate, on which the said object is placed, and the common normal metal element includes a protrusion extending to said insulating membrane, which cools said insulating membrane and thus the said object.

2. A micro refrigerator according to claim 1, characterized in that:

said insulating membrane is part of the surface layer on the substrate, which continues over an opening formed in the substrate and in which in the area of said opening said insulating membrane is supported from the substrate by at least one narrow strip.

3. A micro refrigerator according to claim 2, characterized in that:

there are 2–4 strips and that said strips have a width of 1–10% of the average diameter of the insulating membrane.

4. A micro refrigerator according to claim 1, characterized in that:

the width of said protrusion is, at its narrowest, 0.5–1 $\mu$m and its thickness is 0.05 $\mu$m (20–250 nm) and that it includes a section that widens on the insulating membrane, the surface area of which is at least double the surface area of the rest of the normal metal element.

5. A micro refrigerator according to claim 1, characterized in that:

said insulating membrane is supported from the substrate by at least one protrusion of the normal metal element pair.

6. A micro refrigerator according to claim 1, characterized in that:

the size of said insulating membrane is "200 $\mu$m×200 $\mu$m±50%.

7. A micro refrigerator according to claim 1, characterized in that:

the thickness of said insulating membrane is 50–500 nm.

8. A micro refrigerator according to claim 1, characterized in that:

said insulating membrane generally comprises silicon nitride, with a basic structure $Si_3N_4$.

9. A micro refrigerator according to claim 1, characterized in that:

said superconducting elements are fabricated from a substance from the following group: aluminum (Al), niobium (Nb), high-temperature superconductors (YBCO).

10. A micro refrigerator according to claim 1, characterized in that:

said normal metal elements and said protrusion extending to said insulating membrane are fabricated from a substance from the following group: copper (Cu), silver (Ag), gold (Au).

11. A micro refrigerator according to claim 1, characterized by:

3–100 parallel tunnel junctions fabricated by electron beam lithography in both of the NIS refrigerators of the SINIS unit.

12. A micro refrigerator according to claim 1, characterized in that:

at least 1 tunnel junction in both of the NIS refrigerators of the SINIS unit are fabricated by photolithography.

* * * * *